(12) United States Patent
Tsujimura et al.

(10) Patent No.: US 7,422,770 B2
(45) Date of Patent: Sep. 9, 2008

(54) FORMING A THIN FILM STRUCTURE

(75) Inventors: Takatoshi Tsujimura, Fujisawa (JP); Tomoya Tokuda, Ritto (JP)

(73) Assignee: Chi Mei Optoelectronics Corp. (TW)

( * ) Notice: Subject to any disclaimer, the term of this patent is extended or adjusted under 35 U.S.C. 154(b) by 61 days.

(21) Appl. No.: 10/693,244

(22) Filed: Oct. 24, 2003

(65) Prior Publication Data
US 2004/0137146 A1 Jul. 15, 2004

(30) Foreign Application Priority Data
Oct. 25, 2002 (JP) ............................. 2002-311558

(51) Int. Cl.
*C23C 16/00* (2006.01)
(52) U.S. Cl. ............. 427/255.28; 427/248.1; 427/255.23
(58) Field of Classification Search ......... 427/255.7, 427/255.23, 248.1, 96.8, 255.15, 255.28, 427/458, 588
See application file for complete search history.

(56) References Cited

U.S. PATENT DOCUMENTS

| | | | | |
|---|---|---|---|---|
| 5,242,530 A | * | 9/1993 | Batey et al. | 117/90 |
| 5,686,349 A | * | 11/1997 | Nakata | 438/485 |
| 6,271,062 B1 | * | 8/2001 | Nakata et al. | 438/151 |
| 6,329,270 B1 | * | 12/2001 | Voutsas | 438/488 |
| 6,833,161 B2 | * | 12/2004 | Wang et al. | 427/250 |
| 6,919,266 B2 | * | 7/2005 | Ahn et al. | 438/623 |

FOREIGN PATENT DOCUMENTS

| | | |
|---|---|---|
| JP | 4-266019 | 9/1992 |
| JP | 6-181313 | 6/1994 |

OTHER PUBLICATIONS

A.P. Constant et al., "Thin Film Transistors Based on Microcrystalline Silicon on Polyimide Substrates," Materials Research Society Symp. Proc., vol. 557, pp. 683-688, (1999).

* cited by examiner

*Primary Examiner*—Timothy Meeks
*Assistant Examiner*—David Turocy
(74) *Attorney, Agent, or Firm*—Trop, Pruner & Hu, P.C.

(57) ABSTRACT

A method and apparatus of forming a microcrystalline thin film comprises supplying a first gas and a second gas into a chamber containing a substrate during a first process, and supplying the second gas but not the first gas into the chamber during a second process. The first and second processes are performed plural times to form the microcrystalline thin film.

19 Claims, 11 Drawing Sheets

FORMING A THIN FILM STRUCTURE

TECHNICAL FIELD

The present invention relates to a method of forming a microcrystalline thin film capable of use in a thin film transistor and an image display apparatus using the thin film transistor.

BACKGROUND

Conventionally, thin film structures having silicon (Si) and such as a main ingredient have been used in semiconductor layers for forming thin film transistor channel layers that function as switching elements for an image display apparatus using liquid crystals. A thin film structure using amorphous silicon, which does not exhibit crystallinity, is commonly used. This is because an amorphous silicon thin film can be formed using a low temperature process with relative ease, and the manufacturing cost can be reduced. However, an amorphous silicon thin film has a low mobility of 0.6 cm$^2$/Vs, which presents a problem.

An image display apparatus using liquid crystals has a structure for supplying an electric charge via a switching element to a pixel electrode that corresponds to a pixel. For an image display apparatus with a large number of pixels, a thin film transistor having a channel layer with high mobility is required to improve the switching rate.

As one example of a film structure other than the amorphous silicon thin film, a structure using a microcrystalline thin film has been proposed. A film forming method using plasma chemical vapor deposition, hereafter referred to as "the plasma CVD method", forms a film of silicon in a microcrystalline state.

The plasma CVD method applies a high frequency electric field on a source gas of the semiconductor phase to cause collisions between the source gas and electrons so as to turn the source gas into a reactive plasma state before forming a film on a substrate. When a conventional film forming method is employed, the electric field intensity density irradiated on the source gas needs to be controlled at or below a prescribed value. This is because, when a high energy electric field is applied, the $SiH_2$ produced by breaking down $SiH_4$ is very reactive and bonds to itself to form a polymer before reaching the substrate surface. For this reason, when using the plasma CVD method, a low intensity electric field is irradiated on the source gas $SiH_4$ to break it down to a relatively less reactive $SiH_3$ before forming a film. However, when such a technique is used, a high ratio of dangling bonds of the silicon atoms that constitute the microcrystalline thin film terminate with hydrogen, which makes it difficult to obtain a microcrystalline thin film with high mobility.

Another method of forming a microcrystalline thin film involves the following: after depositing amorphous silicon on a substrate with the plasma CVD method, hydrogen ions or hydrogen plasma is irradiated at the amorphous silicon thin film. According to this method, a source gas prepared by mixing $SiH_4$ and hydrogen is used to form approximately 15 nm of amorphous silicon film on the substrate surface by means of the plasma CVD method, followed by introduction of just hydrogen, and then hydrogen discharge is carried out. Such hydrogen discharge microcrystallizes the amorphous silicon film and converts it to a microcrystalline silicon film.

However, the conventional method for obtaining microcrystalline silicon film from amorphous silicon film has various problems and achievement of sufficient mobility is known to be difficult. The problems of conventional technology are discussed below.

First of all, the aforementioned film forming method has a problem in that the crystalline structure of the obtained microcrystalline silicon film is not good. In the aforementioned film forming method, amorphous silicon film is formed once and then its crystalline structure is converted to microcrystals; however, converting the crystalline structure of the entire amorphous silicon film is not easy and there is a high probability of a certain percentage of amorphous silicon film remaining. Since amorphous silicon film has low mobility, the carrier mobility will be reduced, depending on how much amorphous silicon film remains.

Also, dangling bonds of silicon atoms contained in the amorphous silicon film are terminated with hydrogen atoms. When a hydrogen discharge is used to obtain microcrystalline thin film, hydrogen dissociates in some of the dangling bonds of the silicon atoms and such dangling bonds will bond with other silicon atoms to form microcrystals. To increase bonding between silicon atoms, the intensity of the hydrogen discharge needs to be sufficient; however the use of a high intensity hydrogen discharge in the aforementioned film forming method results in damaging crystalline structures other than the amorphous silicon film, such as the crystalline structure of the substrate. Therefore, when the aforementioned film forming method is used, hydrogen discharge with sufficient intensity cannot be applied, leaving many dangling bonds still terminated with hydrogen, which makes it difficult to improve the mobility of the microcrystalline thin film.

SUMMARY

According to one embodiment, a method of forming a microcrystalline thin film includes supplying, during a first process, a first gas and a second gas to a chamber in which a substrate is located, and supplying, during a second process, the second gas but not the first gas to the chamber. The first process and second process are performed a plurality of times to form the microcrystalline thin film on the substrate.

According to another embodiment, a method of forming a microcrystalline thin film includes activating a first source gas containing an element that forms a polymer when a plurality of molecules of the elements are bonded in the vapor phase, and forming a film having a microcrystalline structure primarily composed of said element on a film forming target object. The following processes are alternately repeated: a source supplying process in which the first source gas is supplied, and a source depositing process in which the supply of said first source gas is stopped and the activated first source gas is deposited on the film forming target object.

Other or alternative features will become apparent from the following description, from the drawings, and from the claims.

DETAILED DESCRIPTION

Figure 1:
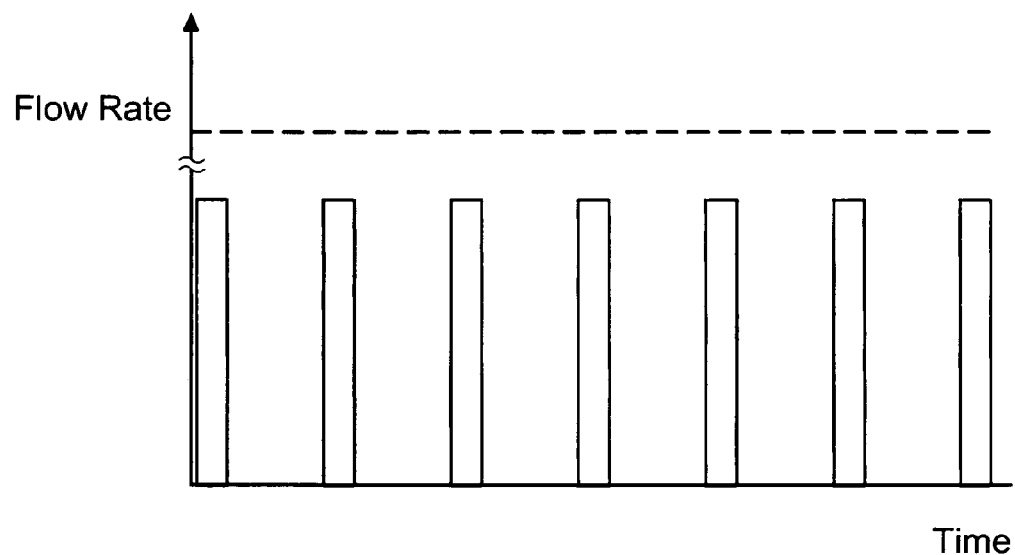
FIG. 1 is a timing chart showing the time dependent flow rates of a first source gas and a second source gas.

In the following description, numerous details are set forth to provide an understanding of the present invention. However, it will be understood by those skilled in the art that the present invention may be practiced without these details and that numerous variations or modifications from the described embodiments are possible.

Some embodiments of the present invention of forming a microcrystalline thin film, of manufacturing a thin film transistor, and of manufacturing an image display apparatus, are described below by referring to drawings. In the drawings, identical or similar parts are denoted with identical or similar symbols and/or names. Note that the drawings are for illustration and differ from the actual objects. Also, the relationships and ratios of dimensions in different drawings are partially different. In addition, with regard to the electrodes constituting a thin film transistor, since there is not sufficient necessity to distinguish between a source electrode and drain electrode, the two electrodes other than the gate electrode are both called "source/drain" electrodes in the following description.

Embodiment 1

According to a first embodiment, a method of forming a microcrystalline thin film includes forming microcrystals by means of a plasma CVD method that uses a first source gas containing an element that forms a polymer when a large number of atoms polymerize as they bond in the vapor phase and a second source gas that does not form a polymer in the vapor phase. Specifically, the method of forming a microcrystalline thin film includes a source supplying process in which the first source gas and the second source gas are supplied and a source depositing process in which the supply of the aforementioned first source gas is stopped and only the second source gas is supplied to form a film of the source supplied in the source supplying process on the substrate. These processes are alternately repeated to form a high quality microcrystalline thin film. In the following description, the element that is the main ingredient of the microcrystalline thin film is assumed to be silicon, and the method of forming a microcrystalline thin film pertaining to the first embodiment is described by using the example in which $SiH_4$ is used for the first source gas and $H_2$ is used for the second source gas.

FIG. 1 is a timing chart showing time dependence of the $SiH_4$ supply rate and $H_2$ supply rate in the method of forming a microcrystalline thin film pertaining to the first embodiment. In FIG. 1, the timing chart drawn with a solid line indicates the $SiH_4$ supply rate and the timing chart drawn with a broken line indicates the $H_2$ supply rate. As shown in FIG. 1, in the method of forming a microcrystalline thin film pertaining to the first embodiment, the $SiH_4$ supply rate goes through pulse-like changes and the supply is discrete. In FIG. 1 the interval when $SiH_4$ is supplied corresponds to the source supplying process, and the interval when the $SiH_4$ is stopped corresponds to the source depositing process. The $H_2$ supply rate is maintained at a constant value throughout the source supplying process and the source depositing process regardless of changes in the $SiH_4$ supply rate.

Figure 2:
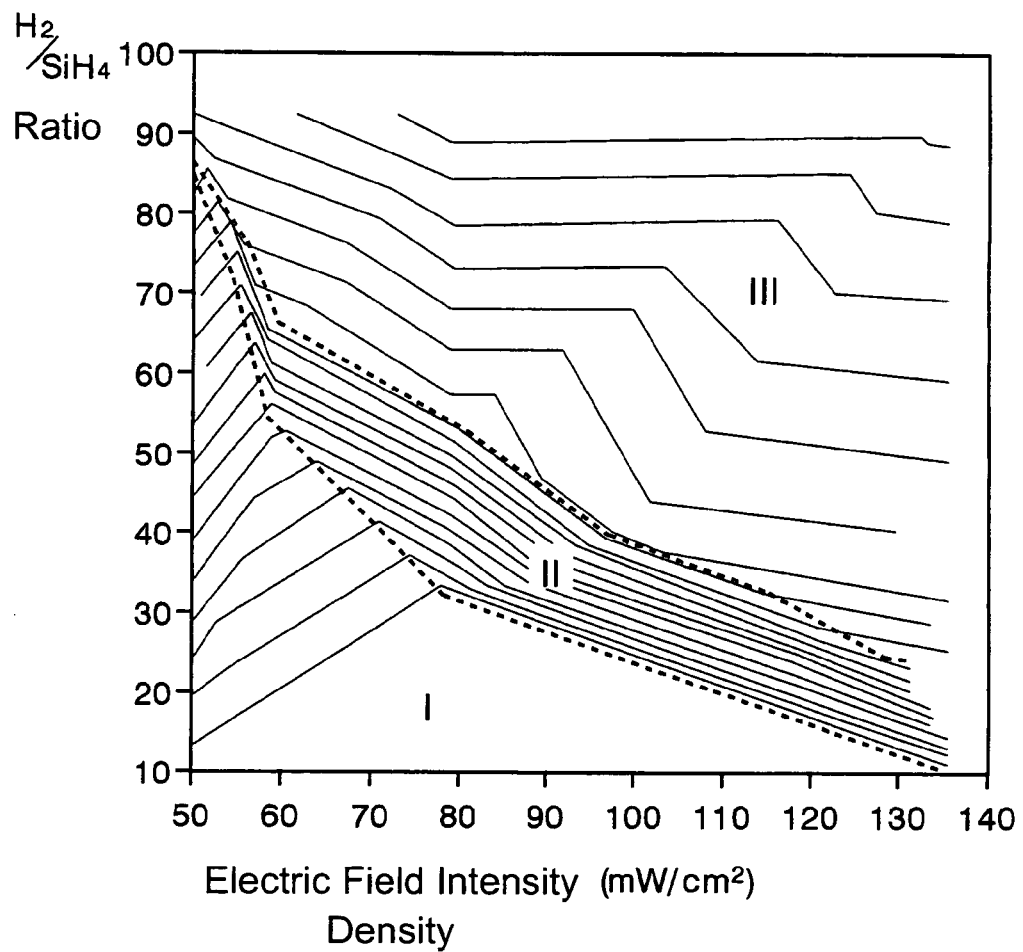
FIG. 2 is a graph showing the relationship between the electric field intensity density and the flow rate ratio of the first source gas to the second source gas.

There is no particular limit to the absolute amount of $SiH_4$ and $H_2$ supplied, but the flow rate ratio of $SiH_4$ and $H_2$ during the source supplying process is limited to a prescribed value (s) in order to prevent the thin film formed on the substrate from becoming amorphous. FIG. 2 is a graph showing the relationship between the flow rate ratio and the film quality of the formed film. The graph shown in FIG. 2 has the flow rate ratio on the vertical axis and the field intensity irradiated on the source gas on the horizontal axis. Area I indicates conditions under which amorphous silicon film is formed and area II indicates conditions under which a film of mixed amorphous silicon and microcrystalline silicon is formed. On the other hand, area III indicates conditions under which only the microcrystalline silicon film is formed. In the method of forming a microcrystalline thin film according to the first embodiment; $SiH_4$ and $H_2$ are supplied at the flow rate ratio that meets the conditions in this area III during the source supplying process. According to one implementation, based on the boundary between area II and area III in FIG. 2, the flow rate ratio r is set in such a way that the flow rate ratio r and the electric field intensity density P ($mV/cm^2$) satisfy:

$$r \geq -(7/12) \times P + 72.5.$$

The electric field intensity irradiated to activate $SiH_4$ and $H_2$ should be set at an intensity sufficient to break $SiH_4$ down to $SiH_2$. For example, in forming a microcrystalline thin film pertaining to embodiment 1 the electric field intensity density can be set at 0.1 $W/cm^2$ throughout the source supplying process and the source depositing process. Other film forming conditions such as the atmospheric pressure in the growth chamber in which the microcrystalline thin film is formed and the film forming temperature can be set in the same manner as in a conventional film forming method. These values are not limited to specific values.

Figure 3:
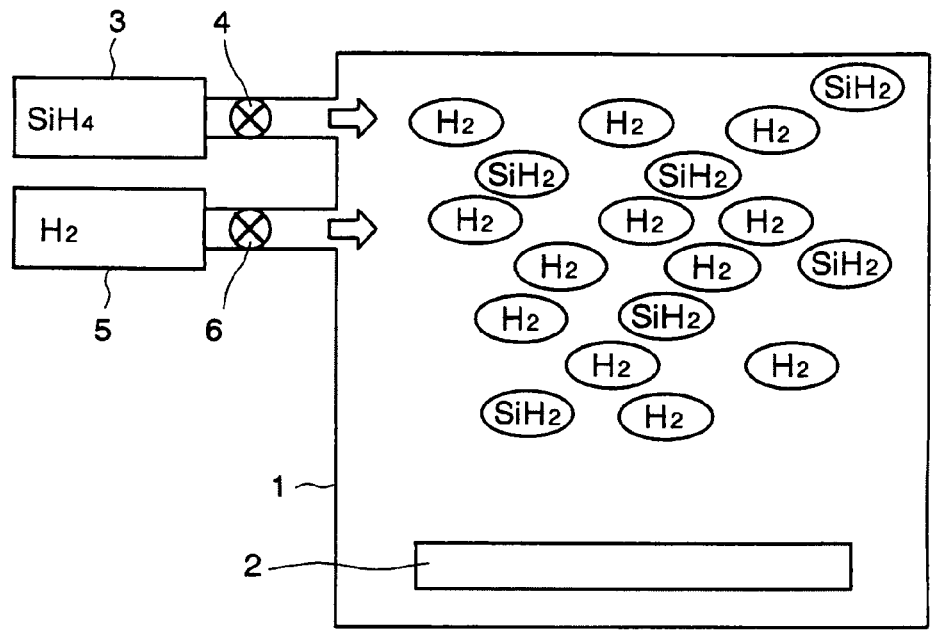
FIG. 3(a) is a schematic diagram showing the inside of the growth chamber during the source supplying process, and 3(b) is a schematic diagram showing the inside of the growth chamber during the source depositing process.
Figure 3:
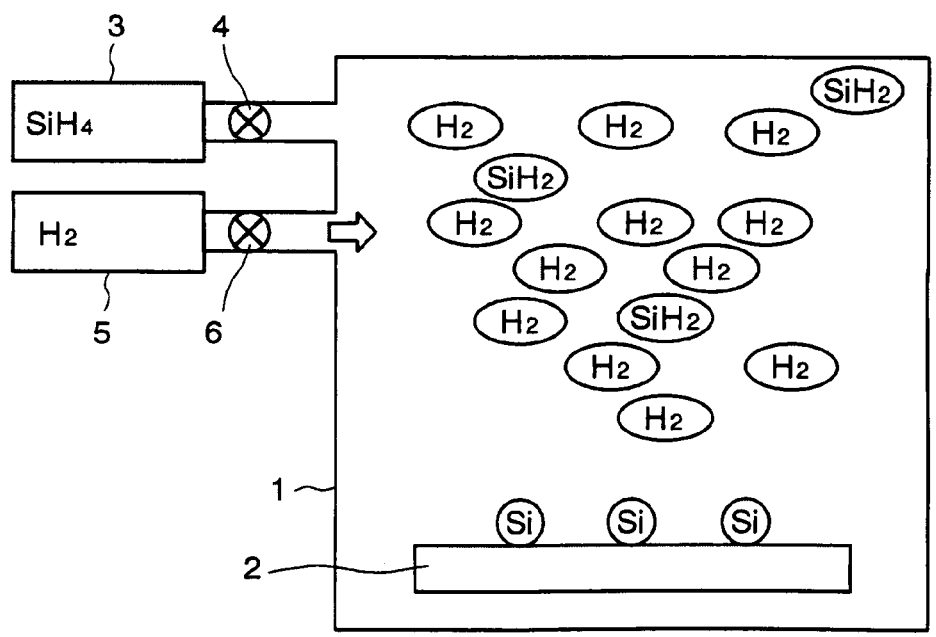

Next, the source supplying process and the source depositing process are described in detail. FIG. 3(a) is a schematic drawing to illustrate the inside of the film forming apparatus during the source supplying process, and FIG. 3(b) is a schematic drawing to illustrate the inside of the growth chamber during the source depositing process.

As shown in FIG. 3(a), in the source supplying process, valve 4 and valve 6 are controlled in such a way that the flow rate ratio becomes a prescribed value that meets the conditions indicated in FIG. 2 and $SiH_4$ and $H_2$ are supplied from $SiH_4$ supply source 3 and $H_2$ supply source 5, respectively, into growth chamber 1. The inside of the growth chamber 1 is irradiated with the electric field of a prescribed intensity and therefore $SiH_4$ supplied into growth chamber 1 is activated and broken down to highly reactive $SiH_2$. Similarly, $H_2$ is activated as well.

As shown in FIG. 13(b), in the source depositing process, valve 4 is closed to stop the $SiH_4$ supply and only $H_2$ is supplied into growth chamber 1. In the situation shown in FIG. 3(b), a large number of $SiH_2$ molecules obtained in the source supplying process are adsorbed on the surface of substrate 2 and Si atoms bond to each other to form microcrystals. If the $SiH_2$ molecules encounter each other before being adsorbed on the surface of substrate 2, a large number of Si bonds occur due to the high reactivity of $SiH_2$, and chain reactions of such bonding lead to polymer production in the vapor phase. If the produced polymer adheres to the surface of substrate 2, then the film quality deteriorates and the mobility drops. Adherence to surfaces other than that of substrate 2 is not preferable either because then the inside of the growth chamber is contaminated.

However, in the method of forming a microcrystalline thin film according to the first embodiment, the film forming is conducted without freshly supplying $SiH_4$, allowing a reduction in probability of $SiH_2$ molecules encountering each other before being adsorbed on the substrate surface. A prescribed amount of $SiH_4$ is supplied during the source supplying process, after which the $SiH_4$ supply is stopped for a certain period, which reduces the probability of $SiH_2$ molecules encountering each other in the vapor phase; as a result, bonding between Si atoms is thus suppressed and generation of $SiH_2$ polymer is prevented or reduced. $SiH_2$ is thus adsorbed on the surface of substrate 2 while maintaining its activated state, forming a microcrystalline thin film primarily composed of silicon.

In one example implementation, the time set for the source supplying process is specified as 2 seconds or less, and the time set for the source depositing process is specified as longer than the time set for the source supplying process. This is because, by keeping the time set for the source supplying process at 2 seconds or less, the amount of $SiH_4$ diffused in growth chamber 1 is reduced and the probability of silicon atoms encountering each other during the source supplying process is reduced, thus effectively suppressing polymer generation. Also, by setting the time for the source depositing process longer than the time for the source supplying process, the residual amount of $SiH_2$ in the vapor phase can be reduced to zero or a level that effectively does not influence subsequent processes.

In the source supplying process again, $SiH_4$ and $H_2$ are supplied into growth chamber 1, as shown in FIG. 3(a). As for the $SiH_4$ supplied before this process, since the majority of it was adsorbed on the crystal surface in the source depositing process, the residual amount in the vapor phase is small and $SiH_2$ molecules will not bond to each other in the new source supplying process either. Subsequently, the source supplying process and the source depositing process are repeated in a similar manner to form a microcrystalline thin film having a desired film thickness.

Some benefits of the method of forming a microcrystalline thin film according to the first embodiment are described below. When a microcrystalline thin film is formed by using this embodiment, the polymer generation due to polymerization of silicon atoms in the vapor phase can be suppressed.

As described above, $SiH_4$ and $H_2$ are supplied at a prescribed flow rate ratio during the source supplying process, and $SiH_2$ is adsorbed on the substrate surface, resulting in a reduction in the amount of $SiH_2$ in the vapor phase. On the other hand, $H_2$ continues to be supplied during the source depositing process as well, and therefore the ratio of $SiH_2$ in all the particles in the vapor phase during the source depositing process decreases sharply. Therefore the probability of $SiH_2$'s encountering each other further decreases, allowing a more effective reduction in polymer generation and a further improvement in the film quality of the microcrystalline thin film thus formed.

Furthermore, in the method of forming a microcrystalline thin film according to the first embodiment, the source depositing process is given enough time for most of the $SiH_2$ in the vapor phase to be adsorbed on the substrate surface. When transitioning again to the source supplying process after the completion of the source depositing process, there is virtually no $SiH_2$ remaining in the vapor phase and polymerization of silicon atoms in the vapor phase can be suppressed even when $SiH_4$ is newly supplied. Therefore, by using the method of forming a microcrystalline thin film according to the first embodiment, a microcrystalline thin film can be formed while polymer generation in the vapor phase is suppressed.

Also, in the method of forming a microcrystalline thin film according to the first embodiment, the substance adsorbed on the substrate surface is $SiH_2$, in which the silicon atom has more unsaturated bonds compared with $SiH_4$ and $SiH_3$. Therefore, when $SiH_2$ is adsorbed on the substrate surface to form microcrystals, the probability of silicon atoms bonding to each other becomes higher, allowing formation of a high quality microcrystalline thin film. In a microcrystalline thin film primarily composed of silicon, the mobility improves as there are more bonds between silicon atoms; therefore a microcrystalline thin film having relatively high mobility can be obtained.

Also, in this method, the microcrystalline thin film is formed directly on the substrate surface, and therefore no hydrogen discharge is necessary after the film forming. This is particularly advantageous when manufacturing a device made of a multi-layer structure such as a thin film transistor. Hydrogen discharge performed on the substrate surface can affect the crystalline structure of films other than the formed silicon thin film. By avoiding hydrogen discharge according to some embodiments, the risk of affecting the substrate and such is eliminated or reduced. Therefore, when a multi-layer structure is implemented by using the method of forming a microcrystalline thin film according to the first embodiment, a microcrystalline thin film can be formed without affecting the electrical properties of the other layers.

According to the first embodiment, parameters other than the flow rate of $SiH_4$ can be maintained at constant values throughout the source supplying process and the source depositing process. This is because maintaining them at constant values allows stable film growth. As for the parameters other than the $SiH_4$ flow rate, values used in conventional plasma CVD methods can be employed.

Manufacturing a thin film transistor by using the method of forming a microcrystalline thin film according to the first embodiment is described below. As for the microcrystalline thin film to be formed, at least a portion of the channel layer of the thin film transistor is formed with the above-described method of forming a microcrystalline thin film. A method of manufacturing an n-channel thin film transistor is described below. A p-channel thin film transistor can also be manufactured in a similar manner. The manufacturing of a thin film transistor is described below by referring to drawings as necessary.

Figure 4:
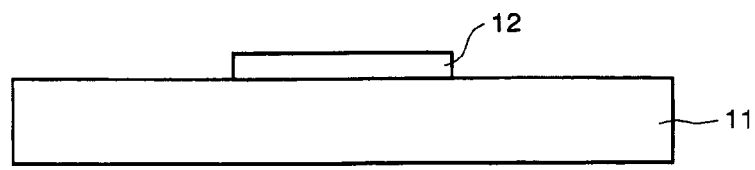
FIGS. 4(a)-(d) are process diagrams to illustrate the method of manufacturing a thin film transistor by using the method of forming a microcrystalline thin film.
Figure 4:
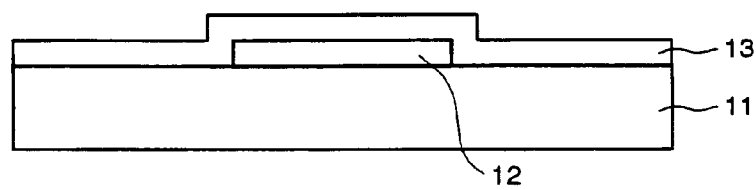

First, as shown in FIG. 4(a), gate electrode 12 is formed on substrate 11. Any desired material can be used to compose the gate electrode; for example, after laminating a low resistance Al (aluminum), stable Mo (molybdenum) is laminated on the Al to protect the Al surface. Gate electrode 12 with a desired shape is formed by means of spattering and such.

As shown in FIG. 4(b), gate insulation layer 13 is laminated on substrate 11 and gate electrode 12. The material to construct gate insulation includes layer 13 SiNx and $SiO_2$ in one implementation. Gate insulation layer 13 can be composed of materials other than these as long as they exhibit good insulation. In FIG. 4(b), gate insulation layer 13 has a single layer structure, but a multi-layer structure with sequentially laminated SiNx and $SiO_2$ layers can also be formed. Gate insulation layer 13 is formed by depositing such materials by means of the CVD method, plasma CVD method, etc.

Figure 4C:
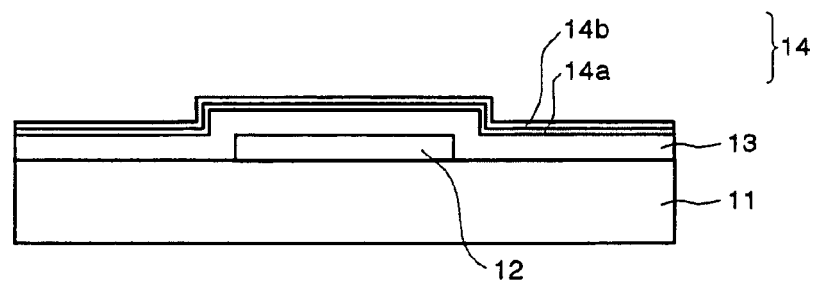

Semiconductor layer 14, from which the channel layer(s) is formed in a later process, is then formed as shown in FIG. 4(c). Semiconductor layer 14 exhibits p-type conductivity and has a structure of, for example, microcrystalline thin film 14a and amorphous thin film 14b primarily made of silicon laminated sequentially. Microcrystalline thin film 14a has a thickness of approximately 1 nm, and the film forming is performed by using the aforementioned method of forming a microcrystalline thin film. Amorphous thin film 14b can be formed with any of a number of techniques, such as a plasma CVD method. For the impurity added to achieve the p-type conductivity, group III elements such as B (boron) can be used. However, for microcrystalline thin film 14a and amorphous thin film 14b, hydrogen that terminates dangling bonds of silicon atoms functions as the impurity and therefore the addition of a new impurity can be omitted.

Figure 4D:
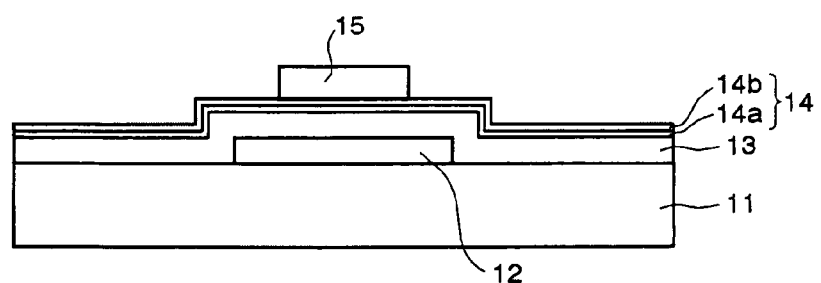

Etching stop layer 15 is then formed as shown in FIG. 4(d). Etching stop layer 15 is designed to prevent erosion of the channel layer when the source/drain electrode(s) is formed by means of etching in a subsequent process. Etching stop layer 15 is composed of SiNx and such. After SiNx film is formed all over with the plasma CVD method, the film is shaped to a desired configuration by means of photolithography and such.

Figure 5:
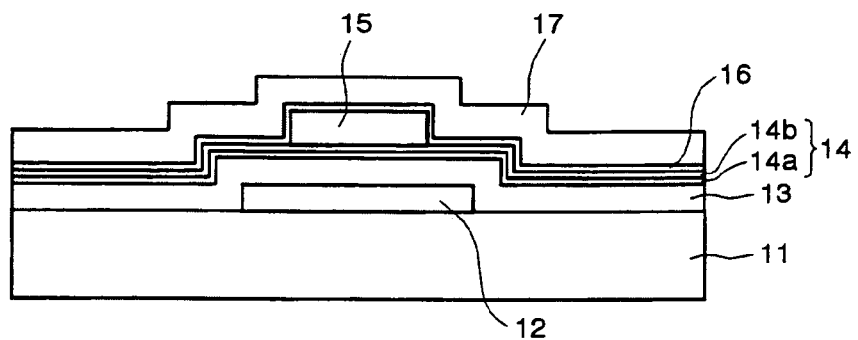
FIGS. 5(a)-(c) are process diagrams to illustrate the method of manufacturing a thin film transistor by using the method of forming a microcrystalline thin film.
Figure 5:
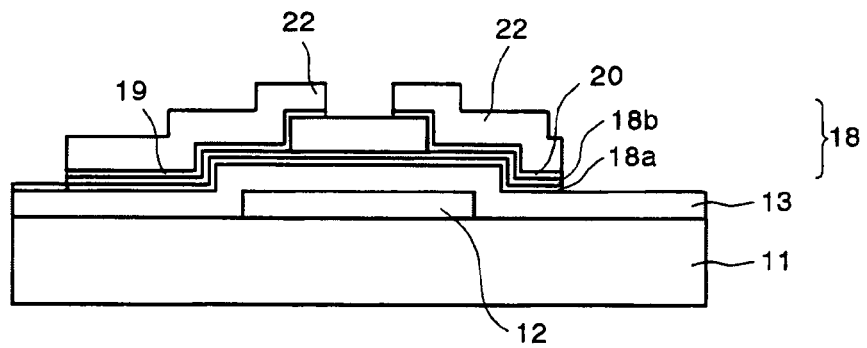
Figure 5:
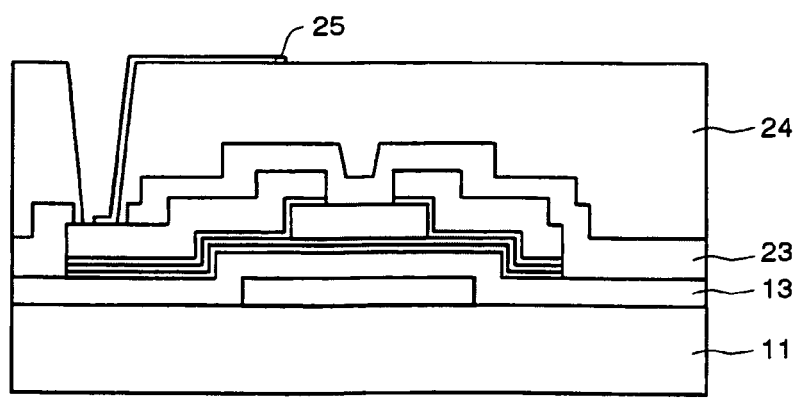

As shown in FIG. 5(a), conductive layer 17, which forms the source/drain electrode in a later process, is laminated on n+semiconductor layer 16. Conductive layer 17 can be laminated with the spattering method and such, but it can be laminated with the CVD method as well.

After this, as shown in FIG. 5(b), etching is carried out using photolithography and such to form channel layer 18, source/drain regions 19 and 20, and source/drain electrodes 21 and 22. Specifically, after applying photoresist on conductive layer 17 by means of spin coating and such, a resist pattern having a prescribed opening is formed by means of photolithography. By using this resist pattern as a mask, etching is carried out to form channel layer 18, source/drain regions 19 and 20, and source/drain electrodes 21 and 22.

After this, as shown in FIG. 5(c), insulation layer 23, planarizing layer 24 and ITO layer 25 are formed. Insulation layer 23 has the role of protecting source/drain/electrodes 21, 22 and such, and planarizing layer 24 has the role of reducing the parasitic capacitance arising between source/drain electrode 22 and ITO layer, 25. ITO layer 25 has the role of connecting source/drain electrode 21 to other circuit elements. By going through the processes described above, a thin film transistor is formed.

In the aforementioned thin film transistor according to one example implementation, channel layer 18 has a structure of sequentially laminated microcrystalline thin film 18a having a film thickness of approximately 1 nm and amorphous thin film 18b. Channel layer 18 can be constructed with just microcrystalline thin film 18a only, but this is not preferable because it would take a long time to form a channel layer 18 of sufficient thickness. On the other hand, it has been shown that the channel induced when a prescribed potential is given to gate electrode 12 exists only in the range of approximately 1 nm from the MIS interface. Therefore, a thin film transistor having high mobility can be implemented by forming microcrystalline thin film 18a in the range of approximately 1 nm from the MIS interface, rather than forming channel layer 18 entirely with microcrystalline thin film.

Figure 6:
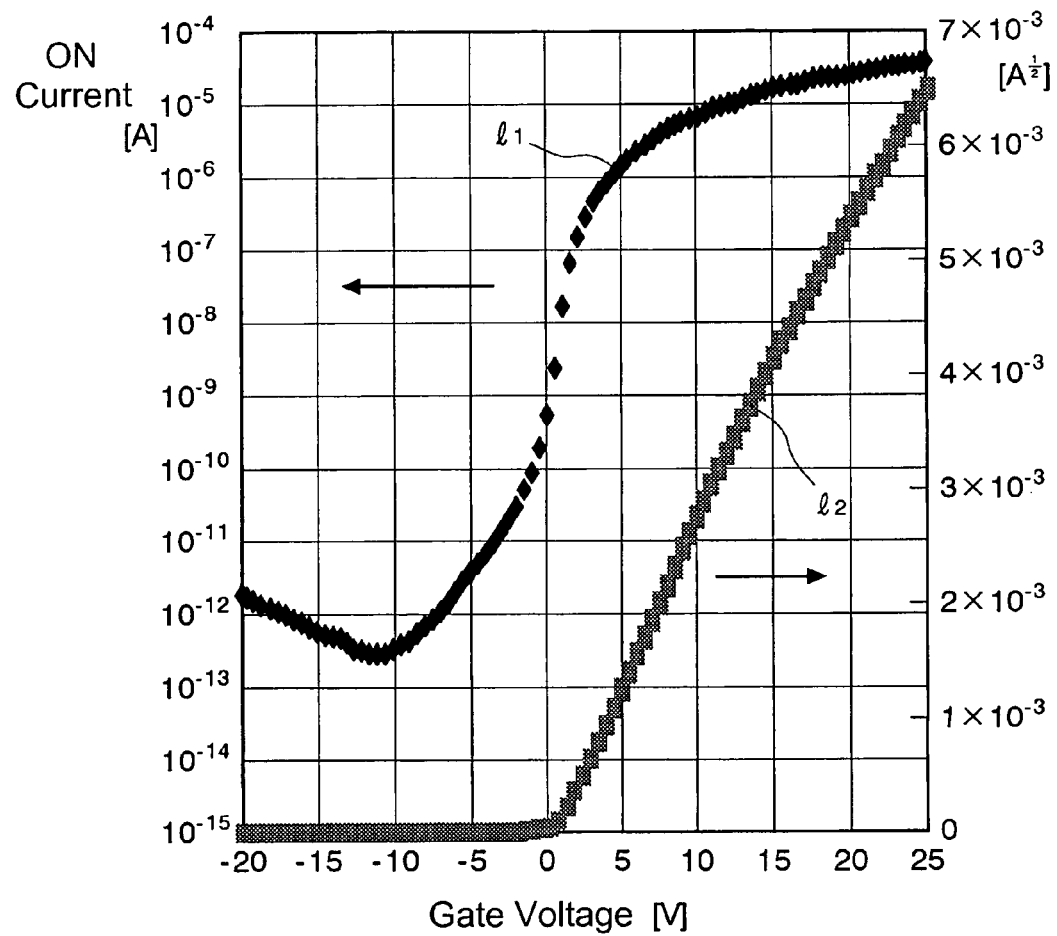
FIG. 6 is a graph showing the electrical properties of the thin film transistor manufactured by using the method of forming a microcrystalline thin film according to an embodiment.
Figure 7:
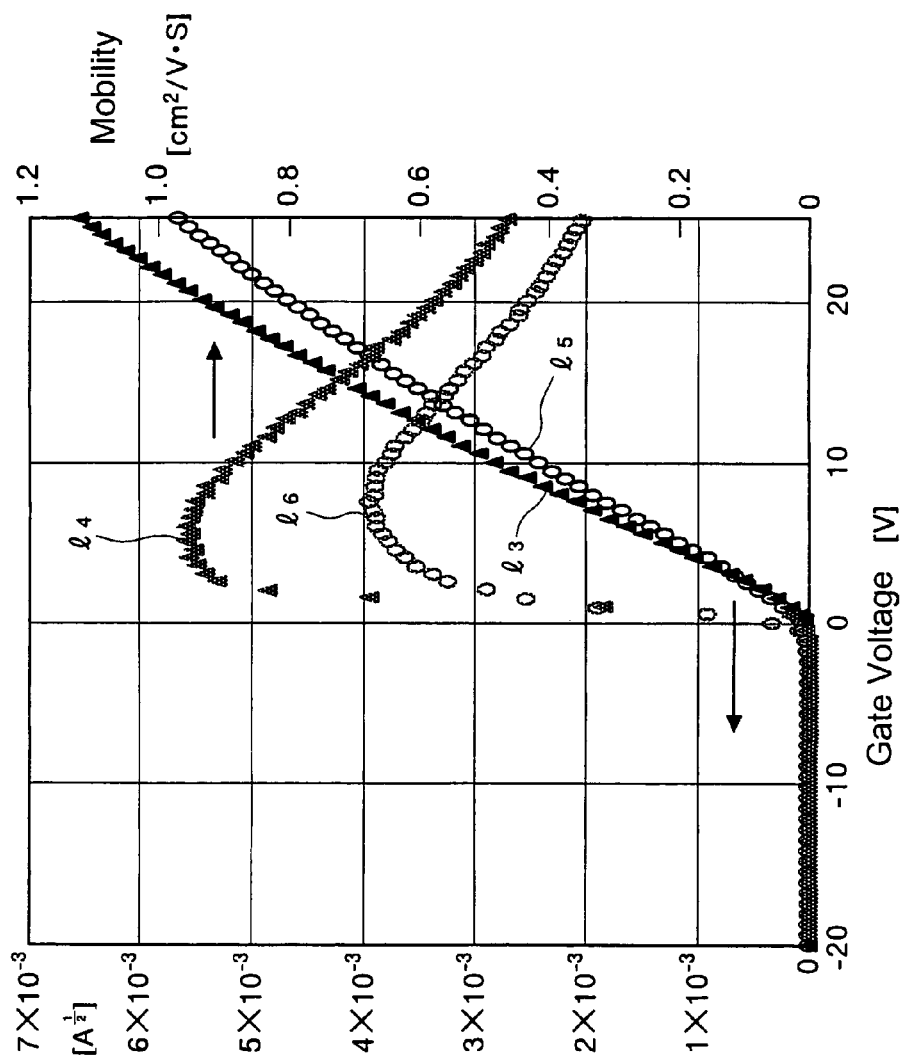
FIG. 7 is a graph comparing the mobility of a thin film transistor manufactured by using the method of forming a microcrystalline thin film according to an embodiment and the mobility of a conventional thin film transistor.

FIG. 6 is a graph showing the gate voltage dependence of the ON current (current flowing in the channel layer) and the square root of the ON current of the thin film transistor. FIG. 7 is a graph of the mobility determined based on the square root of the ON current in comparison with a conventional thin film transistor.

In FIG. 6, curve $1_1$ shows the ON current measurements of the thin film transistor manufactured by using the method of forming a microcrystalline thin film according to the first embodiment, and curve $1_2$ shows square roots of the values on curve $1_1$.

By differentiating this curve $1_2$ with gate voltage Vg as the variable, the mobility can be determined. FIG. 7 has curve $1_3$ that is identical to curve $1_2$ of FIG. 6 and curve 14 that shows the gate voltage dependence of the mobility derived from values on curve $1_3$. Curve $1_5$ and $1_6$ are graphs shown for comparison; curve $1_5$ shows the square root values of the ON current of a thin film transistor whose channel layer is formed only with conventional amorphous silicon thin film, and curve $1_6$ shows the mobility derived from curve $1_5$.

By comparing curve $1_4$ and curve $1_6$ in FIG. 7 it becomes clear that, while the conventional mobility is 0.7 $cm^2/Vs$ or less, the mobility of the thin film transistor prepared by using the method of forming a microcrystalline thin film according to the first embodiment is a relatively high value of about 0.957 $cm^2/Vs$. Thus, the mobility of the microcrystalline thin film according to some embodiments is higher than 0.7 $cm^2/Vs$.

Embodiment 2

Figure 8:
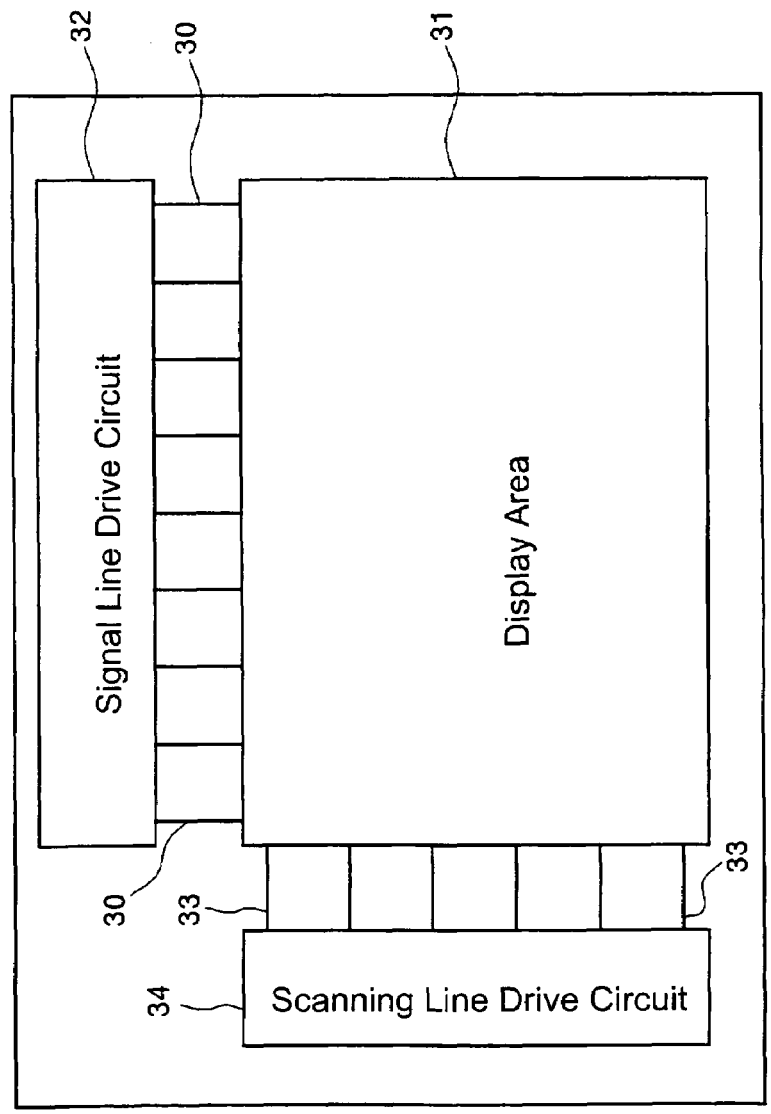
FIG. 8 is a schematic diagram showing the structure of the array substrate that constitutes the image display apparatus according to an embodiment.
Figure 9:
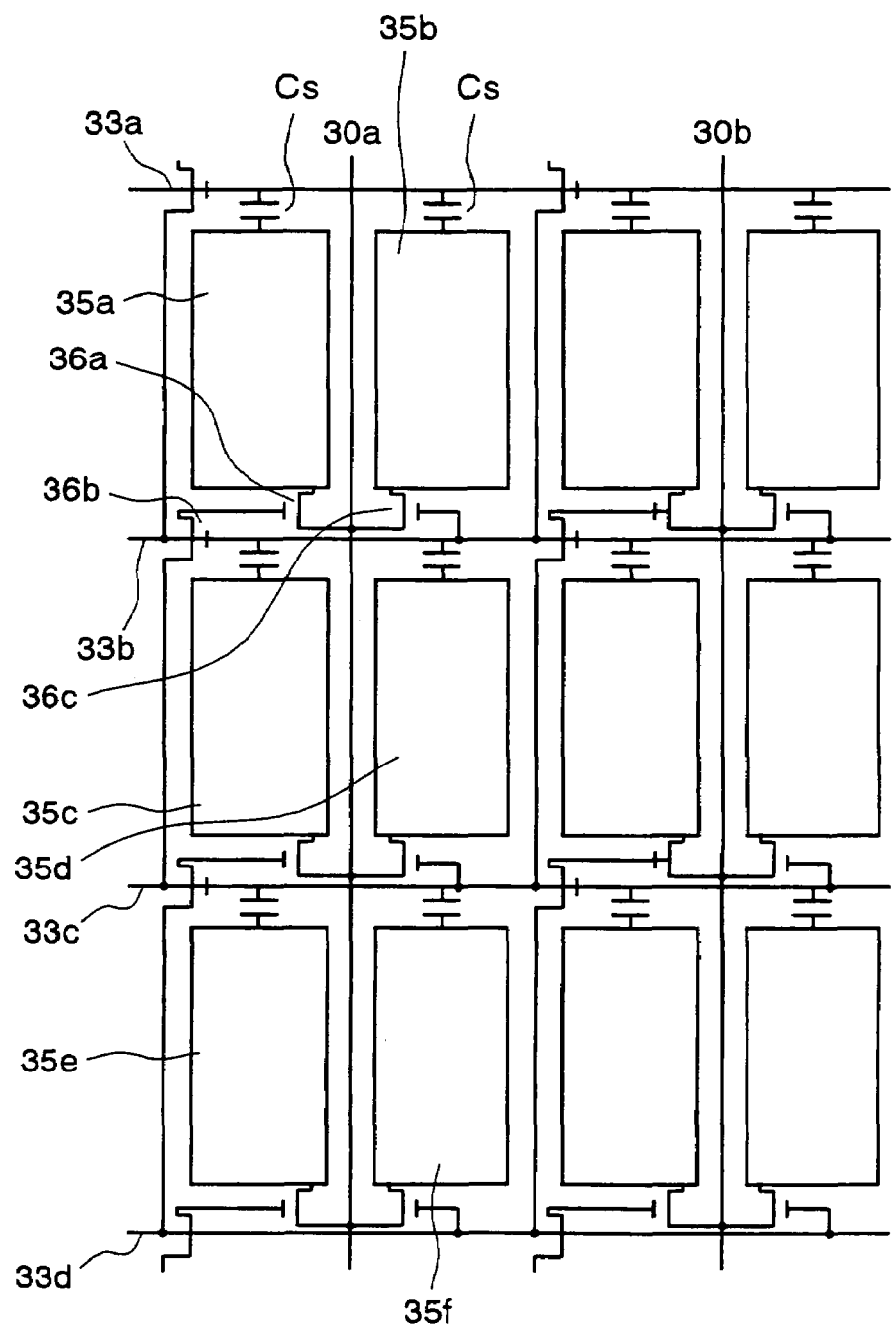
FIG. 9 is an equivalent circuit diagram showing the circuit structure provided on the array substrate.

An image display apparatus according to a second embodiment is described below. The image display apparatus is constructed by using the thin film transistor(s) formed by using the method of forming a microcrystalline thin film according to the first embodiment. FIG. 8 is, a simplified diagram showing the main configuration of the array substrate that constitutes the image display apparatus, and FIG. 9 is a diagram showing the circuit configuration of the array substrate. If the image display apparatus is, for example, a liquid crystal display apparatus, then an opposite substrate placed opposite to the array substrate, a liquid crystal layer encapsulated between the array substrate and the opposite substrate, a back light to feed light to the liquid crystal layer, and so forth, are present; however, these components are not described for brevity.

As shown in FIG. 8, the array substrate has signal line drive circuit 32 to supply a display signal(s), by applying an electric potential, via signal line 30 to pixel electrodes deployed in display area 31, and scanning line drive circuit 34 to supply a control signal via scanning line 33 to control the on/off sate of a thin film transistor(s) deployed corresponding to the pixel electrode(s).

In display area 31, as shown in FIG. 9, a first thin film transistor 36a, second thin film transistor 36b, and third thin film transistor 36c are deployed for pixel electrodes 35a and 35b, which are next to each other across signal line 30a. Specifically, for the first thin film transistor 36a, one source/drain electrode is connected to signal line 30a and the other source/drain electrode is connected to pixel electrode 35a.

The gate electrode of the first thin film transistor 36a is connected to one source/drain electrode of the second thin film transistor 36b.

For the second thin film transistor 36b, one source/drain electrode is connected to the gate electrode of the first thin film transistor 36a and the other source/drain electrode is connected to scanning line 33c. Therefore, the gate electrode of the first thin film transistor 36a is connected to the second thin film transistor 36b via scanning line 33c. The gate electrode of the second thin film transistor 36b is connected to scanning line 33b.

Furthermore, for the third thin film transistor 36c, one source/drain electrode is connected to signal line 30a and the other source/drain electrode is connected to pixel electrode 35b. The gate electrode of the third thin film transistor 36c is connected to scanning line 33b.

Because of this structure, in order to turn on the first thin film transistor 36a, for example, both scanning line 33b and scanning line 33c are set at the selection potential. This structure is such that the potential of signal line 30a is supplied to pixel electrode 35a at the time when both scanning lines have the selection potential. Similarly, in order to turn on the first thin film transistor 36c, scanning line 33b is set at the selection potential; this structure is such that the potential of signal line 30a is supplied to pixel electrode 35b at the time when scanning line 33b has the selection potential. This wiring structure applies to other pixel electrodes in display area 31 and corresponding thin film transistors.

Figure 10:
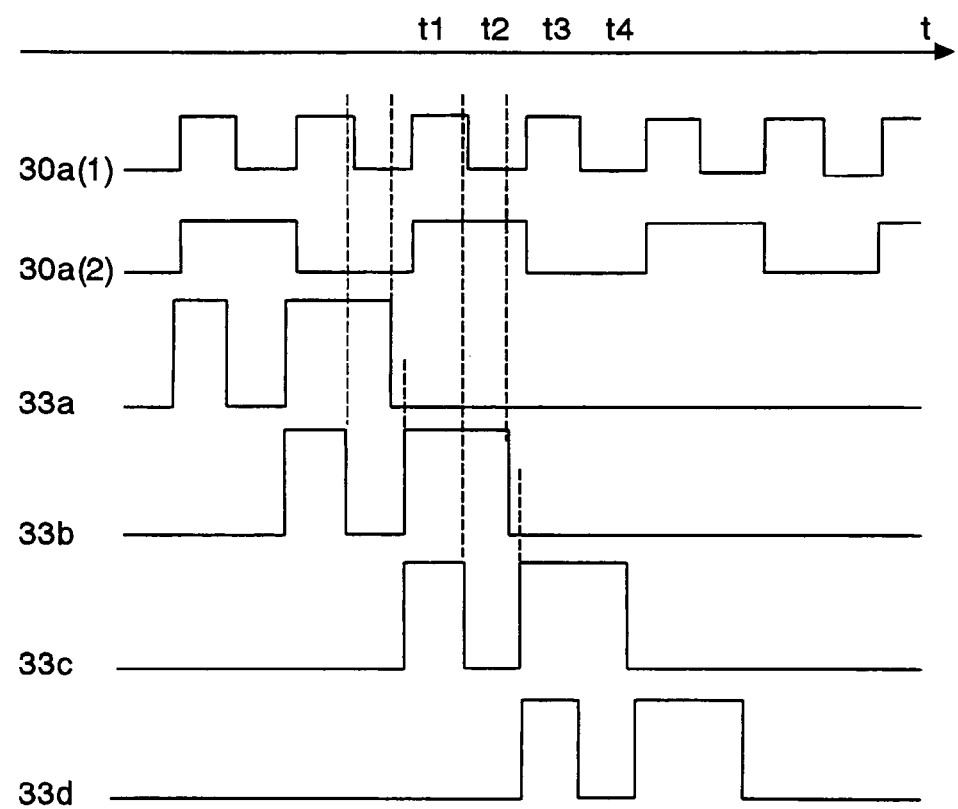
FIG. 10 is a timing chart showing changes in electric potentials on signal lines and such during the operation of the image display apparatus according to an embodiment.

Next, operation of the array substrate having the structure shown in FIG. 8 and FIG. 9 in the image display apparatus is described below. FIG. 10 is, a timing chart showing the time dependence of the scanning signals supplied from the scanning lines and the display signals supplied from the signal lines. Descriptions are given below by referring to FIG. 9 and FIG. 10.

FIG. 10 shows, starting at the top, an example of a waveform of the display signal supplied by signal line 30a (1), another example of a waveform of the display signal (2), and waveforms of scanning line 33a, scanning line 33b, scanning line 33c, and scanning line 33d. The twaveforms of the display signal include changes in gradation and polarity. Looking at the waveforms in terms of changes in polarity, when the potential of signal line 30a changes according to signal line 30a (1), the polarity of pixel electrode 35a is different from the polarity of pixel electrode 35b, and the polarity of pixel electrode 35a is identical to the polarity of pixel electrode 35c. On the other hand, when the potential changes according to signal line 30a (2), the polarity of pixel electrode. 35a is identical to the polarity of pixel electrode 35b, and the polarity of pixel electrode 35a is different from the polarity of pixel electrode 35c.

In FIG. 10, the waveforms of scanning lines 33a-33d indicate selection and un-selection. Specifically; a high level indicates that the corresponding scanning line is selected, and otherwise the corresponding scanning line is in an un-selected state.

During the time period t1, between the time when scanning line 33b and scanning line 33c are both selected and the time when scanning line 33c assumes the un-selection potential, the first thin film transistor 36a through the third thin film transistor 36c are turned on. In this time period t1, the potential V1 to be given to pixel electrode 35a is supplied from signal line 30a. This determines the potential at pixel electrode 35a.

After scanning line 33c turns to the un-selection potential, the potential supplied from signal line 30a changes to V1b, and this potential is given to pixel electrode 35b to determine the potential of pixel electrode 35b. As shown in FIG. 10, during time period t2 after scanning line 33c assumes the unselected potential, maintaining scanning line 33b at the selected potential turns off the first thin film transistor 36a and turns on thin film transistor M3. Therefore, while supply of the potential to pixel electrode 35a stops, the potential continues to be supplied from signal line 30a and the potential of pixel electrode 35b is thus determined.

During time period t3 after scanning line 33b assumes the un-selection potential, the potential supplied from signal line 30a changes to V1c, so that scanning line 33c assumes the selected potential again and scanning line 33d also assumes the selection potential. Because of this, potential V1c is supplied to pixel electrode 35c, pixel electrode 35d, and pixel electrode 35f, and the potential of pixel electrode 35c is determined. In this manner, the scanning line to assume the selection potential is sequentially switched and correspondingly the potential of signal line 30a is also switched to determine the potentials of pixel electrodes adjacent to each other across signal line 30a. After this, under the control of signal line drive circuit 32, the supply source of the display signal is switched from signal line 30a to signal line 30b, and in the same manner as describe above the scanning line potentials are sequentially switched to determine the potentials of pixel electrodes adjacent to each other across signal line 30b. By repeating the above described operation, the potentials of all the pixel electrodes in display area 31 are determined, and the image is displayed by the electro-optical effect of, for example, the liquid crystal layer deployed on the TFT array substrate.

In the image display apparatus according to the second embodiment, a plurality of thin film transistors are deployed for a single pixel electrode and the potential is supplied via a single signal line to pixel electrodes that belong to a plurality of columns. Because of this structure, the number of signal lines can be reduced compared with a conventional design; in the above described example it is reduced to a half of that of a conventional design. A reduction in the number of signal lines allows a reduction in the number of drive IC's that constitute the signal drive circuit, resulting in a reduction in the manufacturing cost. Also, a reduction in the number of signal lines allows a reduction in the number of electrode pads for connecting the array substrate to the signal drive circuit and an expansion of the width of each electrode pad, thus reducing the risk of line breakage at electrode pads.

On the other hand, since the image display apparatus according to the second embodiment has a configuration in which a plurality of thin film transistors function to determine the potential of an individual pixel electrode, the time required to determine the potential of each pixel electrode is significantly influenced by the mobility of the thin film transistors. Taking pixel electrode 35a as an example, the first thin film transistor 36a and the second thin film transistor 36b need to be driven to supply a potential to pixel electrode 35a. To turn on the second thin film transistor 36b, the first thin film transistor 36a is turned on and the gate electrode of the second thin film transistor 36b is supplied with a charge corresponding to the ON voltage via the channel layer of the first thin film transistor 36a. Because of this, the time required to supply a prescribed charge corresponding to the ON voltage of the second thin film transistor 36b is dependent on the mobility in the channel layer of the first thin film transistor 36a. Also, as describe above, the potential of pixel electrode 35a is given by a charge supplied via the channel layer of the second thin film transistor 36b. Because of this, the time required from tuning on the second thin film transistor 36b to setting pixel electrode 35a at a prescribed potential is dependent on the mobility in the channel layer of the second thin film transistor 36b. Therefore, between the time of selecting a scanning line and the time when the potential of the pixel electrode(s) is actually determined, there is a time delay due to the mobility of the channel layer in a plurality of thin film transistors.

When the time delay due to the channel layer of the thin film transistor is significant, the number of pixels deployed in the display area becomes limited and implementation of a highly fine or large screen image display apparatus becomes difficult. For example, when motion pictures are displayed, the time allowed for the determination of the potentials of all the pixel electrodes is a constant regardless of the number of pixels, and as the number of pixels increases the time allowed for determining the potential of each pixel electrode becomes shorter. When there is a certain time delay, the time allowed for determining the potential of each pixel electrode needs to be made longer, resulting in the necessity to suppress the number of pixels.

In the image display apparatus, at least one of, and preferably both of, the first thin film transistor 36a and the second thin film transistor 36b that supply a potential to the pixel electrode(s) has at least a portion of its channel layer formed by using the method of forming a microcrystalline film discussed above. Therefore, in the image display apparatus pertaining to the second embodiment, the time delay that occurs when determining the potential of each pixel electrode can be reduced and a highly fine or large screen image display apparatus can be implemented. The same is true for thin film transistor 36c; at least a portion of the channel layer is formed using the method of forming a microcrystalline film discussed above.

The image display apparatus in which a plurality of thin film transistors are deployed for each pixel electrode, as shown in FIG. 9, is described as an example of the significant influence of the mobility in the channel layer of a thin film transistor on the electrical properties. However, applications for the thin film transistor utilizing the method of forming a microcrystalline thin film discussed above are not limited to the image display apparatus having the aforementioned structure. The time delay due to the mobility in the channel layer of the thin film transistors functioning as switching elements is more or less a problem also, for example, in a liquid crystal display apparatus using the active matrix, and in an in-plane switching liquid crystal display apparatus having a structure in which pixel electrodes and common electrodes are deployed on the array substrate. In other embodiments, the thin film transistors discussed above can be used in switching elements having different arrangements than in FIG. 9. Examples of a structures in which a plurality of thin film transistors are deployed for each pixel electrode include those described in Japanese Patent Laid-Open No. Hei 6-148680 bulletin, Japanese Patent Laid-Open No. Hei 11-2837 bulletin, Japanese Patent Laid-Open No. Hei 5-26504 bulletin, Japanese Patent Laid-Open No. Hei 5-188395 bulletin, and Japanese Patent Laid-Open No. Hei 5-303114 bulletin. The thin film transistor according to the first embodiment can be used for these structures.

Embodiment 3

Figure 11:
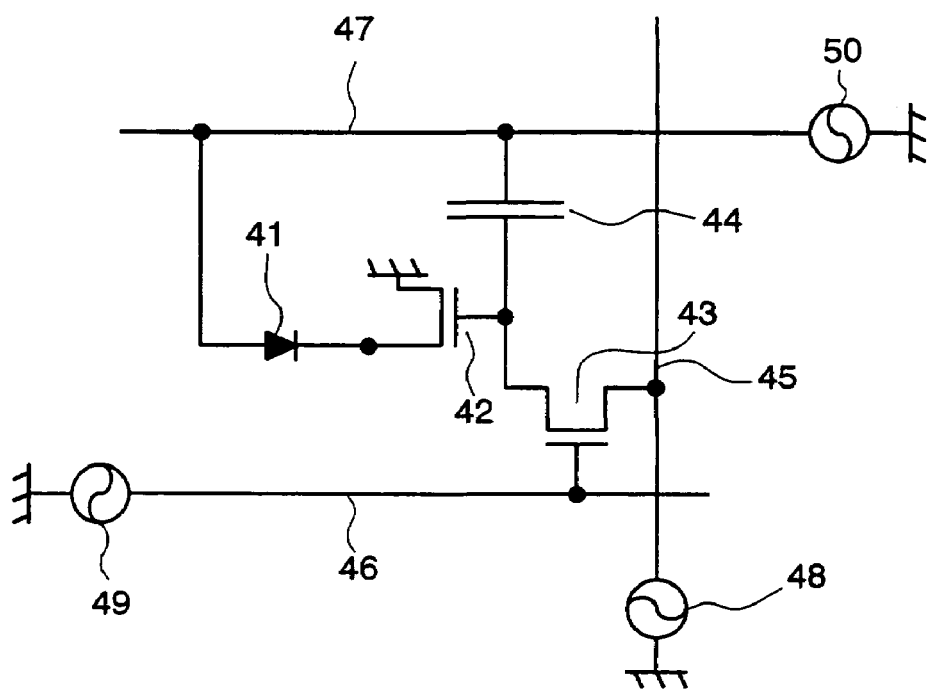
FIG. 11 is an equivalent circuit diagram showing the structure of a part of the image display apparatus according to an embodiment.

Next, an image display apparatus according to a third embodiment is described below. This image display apparatus has a current driven light emitting element(s) and the current fed to the light emitting element is controlled by a thin film transistor(s). FIG. 11 is a circuit diagram showing the wiring structure corresponding to any pixel within the display area of this image display apparatus. The description of the overall structure is omitted below because it is the same as that of the image display apparatus according to the second embodiment; that is, the image display apparatus has pixels deployed in a matrix fashion, a plurality of signal lines and scanning lines are deployed corresponding to the pixels, and these signal lines and scanning lines are connected to the signal drive circuit and the scanning line drive circuit, respectively.

The image display apparatus of FIG. 11 has organic EL element 41 that functions as a current driven light emitting element and thin film transistor 42 that functions as a driver element to control the current value injected into organic EL element 41. Also, the image display apparatus has thin film transistor 43 that controls the on/off state of thin film transistor 32 and functions as a switching element. Here, at least one of thin film transistors 42 and 43 has a channel layer formed by using the method of forming a microcrystalline thin film according to the first embodiment.

In the image display apparatus shown in FIG. 11, one source/drain electrode of thin film transistor 42 is connected to organic EL element 41 and the gate electrode is connected to one source/drain electrode of thin film transistor 43. The other source/drain electrode of thin film transistor 42 is connected to accumulator capacitance 44. Accumulator capacitance 44 has the function of accumulating the electric charge supplied from thin film transistor 43. In this structure, one source/drain electrode of thin film transistor 43 is connected to the gate electrode of thin film transistor 42, and the other source/drain electrode is connected to scanning line 46. Also, the image display apparatus has power supply line 47 to supply current to organic EL element 41; and signal line 45, scanning line 46, and power supply line 47 are connected to signal line drive circuit 48, scanning line drive circuit 49, and power supply line drive circuit 50, respectively.

Next, the operation of the image display apparatus shown in FIG. 11 is described below. The image display apparatus sets prescribed potentials on scanning line 46 and signal line 45 corresponding to the selected pixel, according to the image data input from outside. Based on the potential given to scanning line 46, thin film transistor 43 is turned on; based on the potential given to signal line 45, electric charge is accumulated in accumulator capacitance 44; and based on the amount of the accumulated charge, the gate potential of thin film transistor 42 is determined. Thin film transistor 42 is electrically connected to power supply line 47, and a current corresponding to the mobility flows in the channel layer of thin film transistor 42. Since organic EL element 41 is connected in series with thin film transistor 42, a current corresponding to the mobility of thin film transistor 42 flows.

In this embodiment, at least one of thin film transistors 42 and 43 is specified to have a channel layer formed by using the method of forming a microcrystalline film according to the first embodiment. For example, when the channel layer of thin film transistor 43 is formed by using the method of forming a microcrystalline film according to the first embodiment, a switching element capable of fast operation is obtained and therefore a highly fine or large screen image display apparatus can be implemented. Also, when the channel layer of thin film transistor 42 is formed by using the method of forming a microcrystalline film described above, the brightness of organic EL element 41 can be improved. This is because, as described above, organic EL element 41 is connected to thin film transistor 42 and the current value flowing into organic EL element 41 is dependent on the mobility in the channel layer of thin film transistor 42. Therefore, when the channel layer of thin film transistor 42 is formed by using the method of forming a microcrystalline film according to the first embodiment, a large current can flow into organic EL element 41 and the brightness of this current driven organic EL element 41 can be improved.

The image display apparatus according to the third embodiment can be applied to image display apparatus with any structure having current driven light emitting elements. Therefore, the light emitting element does not have to be an organic EL element; for example, an inorganic EL element can be used as well for the light emitting element.

As described thus far, some embodiments of the present invention alternately repeat the source supplying process that supplies the first source gas containing the element that is to be the main ingredient of the microcrystalline thin film to be formed and the source depositing process in which the supply of the first source gas is stopped and film is formed while bonding within the activated first source gas in the vapor phase is suppressed. As a result, the polymer formation due to the activated first source gas molecules encountering each other in the vapor phase is suppressed, which has an effect of allowing formation of microcrystalline thin film having high mobility on the film forming target object.

Also, some embodiments of the present invention specifies that the flow ratio r and the electric field intensity density P satisfy the condition $r \geq -(7/12) \times P + 72.5$, which has an effect of even more effectively suppressing formation of polymer by the activated first source gas in the vapor phase during the source supplying process.

Also, some embodiments of the present invention specifies that the source supplying process be 2 seconds or less, which has an effect of further suppressing formation of polymer by the activated first source gas during the source supplying process; and also specifies that the time required for the source depositing process be longer, which has an effect of allowing a reduction in the residual amount of the activated first source gas in the vapor phase at the end of the source depositing process.

Also, some embodiments of the present invention enables suppression of polymer formation by the first source gas in the vapor phase, which allows use of highly reactive $SiH_2$ and use of $SiH_2$ has an effect of allowing formation of microcrystalline thin film with improved mobility.

Also, some embodiments of the present invention has an effect of enabling the manufacturing of a high mobility thin film transistor by forming microcrystalline thin film with the aforementioned method, and also an effect of enabling implementation of a highly fine and/or large screen image display apparatus by constructing the image display apparatus using this thin film transistor.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A method of forming a microcrystalline thin film, comprising:
    supplying, during a first process, $SiH_4$ and $H_2$ to a chamber in which a substrate is located;
    during the first process, applying an electric field to break down the $SiH_4$ to $SiH_2$;
    supplying, during a second process, $H_2$ but not $SiH_4$ to the chamber;
    depositing a portion of the microcrystalline thin film during the second process, wherein depositing the portion comprises adsorbing the SiH2 to a surface of the substrate to form microcrystals, and wherein the portion of the microcrystalline thin film is formed without converting amorphous silicon to the microcrystals; and
    performing the first process and second process a plurality of times to form the microcrystalline thin film having a target film thickness on the substrate.

2. The method of claim 1, wherein performing the first process and second process a plurality of times is performed without removing the substrate from the chamber.

3. A method of forming a microcrystalline thin film, comprising:
    supplying, during a first process, $SiH_4$ and $H_2$ to a chamber in which a substrate is located;
    supplying, during a second process, $H_2$ but not $SiH_4$ to the chamber;
    depositing a portion of the microcrystalline thin film during the second process; and
    performing the first process and second process a plurality of times to form the microcrystalline thin film having a target film thickness on the substrate,
    wherein supplying $SiH_4$ and $H_2$ during the first process comprises supplying $SiH_4$ at a first rate and $H_2$ at a second rate, the first rate and second rate defining a flow rate ratio that prevents a thin film formed on the substrate from becoming amorphous.

4. The method of claim 3, further comprising applying an electric field in the chamber to break down the $SiH_4$ to $SiH_2$.

5. The method of claim 4, wherein supplying the $H_2$ comprises supplying the $H_2$ at a generally constant rate.

6. The method of claim 4, further comprising depositing the $SiH_2$ to a surface of the substrate during the second process.

7. The method of claim 3, further comprising:
    converting $SiH_4$ to $SiH_2$; and
    depositing $SiH_2$ on the substrate during the second process.

8. The method of claim 7, wherein depositing $SiH_2$ on the substrate during the second process without supplying $SiH_4$ reduces formation of a polymer clue to $SiH_2$ molecules encountering each other prior to depositing of $SiH_2$ on the substrate.

9. The method of claim 3, further comprising applying an electric field during the first process, the electric field set at an intensity that in combination with the flow rate ratio prevents a thin film formed on the substrate from becoming amorphous.

10. A method of forming a niicrocrystalline thin film by activating $SiH_4$, and forming a film having a inicrocrystalline structure on a film forming target object, wherein activating $SiH_4$ comprises applying an electric field to break down $SiH_4$ to $SiH_2$, the method further comprising:
    performing a source supplying process in which $SiH_4$ is supplied,
    performing a source depositing process in which the supply of $SiH_4$ is stopped and $SiH_2$ is deposited on the film forming target object to form the microcrystalline structure, and
    supplying $H_2$ during the source supplying process and during the source depositing process, $SiH_4$ and $H_2$ being supplied at flow rates during the source supplying process to prevent a film formed on the film forming target object from becoming amorphous.

11. The method of claim 10, wherein bonding of $SiH_2$ is suppressed in the source depositing process.

12. The method of claim 10, wherein $H_2$ is supplied at a constant flow rate throughout said source supplying process and said source depositing process.

13. The method of claim 10, wherein a flow rate ratio, r, of $SiH_4$ and $H_2$ satisfies $r \geq -(7/12) \times P + 72.5$, where P is an electric field intensity density irradiated on $SiH_4$ and $H_2$.

14. The method of claim 10, wherein performing said source supplying process comprises performing the source supplying process for 2 seconds or less, and performing said source depositing process comprises performing said source depositing process for longer than said source supplying process.

15. A method of manufacturing a thin film transistor comprising:
    forming a gate electrode on the substrate;
    forming an insulation layer film on said substrate and said gate electrode,
    forming at least a portion of a channel layer film on said insulation layer by using the microcrystalline thin film forming method of claim 10; and
    forming a source/drain electrode on said channel layer.

16. The method of manufacturing a thin film transistor of claim 15, wherein forming the channel layer film comprises fonning the microcrystalline thin film up to 1 nm away into the channel layer film from the interface with said insulation layer.

17. A method of forming a microcrystalline thin film, comprising:
    supplying, during a source supplying process, $SiH_4$ and $H_2$ to a chamber in which a substrate is located, wherein the $SiH_4$ is supplied at a first rate and the $H_2$ is supplied at a second rate, the first and second rates defining a flow rate ratio to prevent formation of a layer of an amorphous film during the source supplying process; supplying, during a second process, $H_2$ but not $SiH_4$ to the chamber; and
    depositing the microcrystalline thin film on the substrate, during the second process.

18. The method of claim 17, further comprising:
    applying an electric field in the chamber during the source supplying process to break down $SiH_4$ to $SiH_2$ molecules,
    wherein a majority of the $SiH_2$ molecules is adsorbed on the substrate during the second process to deposit the microcrystalline thin film on the substrate.

19. A method of forming a microcrystalline thin film, comprising:
    supplying, during a first process $SiH_4$ and $H_2$ to a chamber in which a substrate is located; supplying, during a second process, $H_2$ but not $SiH_4$ to the chamber; and
    depositing the microcrystalline thin film on the substrate during the second process;
    wherein supplying $SiH_4$ and $H_2$ comprises supplying $SiH_4$ at a first rate and $H_2$ at a second rate, the first rate and second rate defining a flow race ratio that prevents a thin film formed on the substrate from becoming amorphous.

* * * * *

UNITED STATES PATENT AND TRADEMARK OFFICE
CERTIFICATE OF CORRECTION

PATENT NO. : 7,422,770 B2  Page 1 of 1
APPLICATION NO. : 10/693244
DATED : September 9, 2008
INVENTOR(S) : Takatoshi Tsujimura and Tomoya Tokuda It is certified that error appears in the above-identified patent and that said Letters Patent is hereby corrected as shown below:

Column 13:
Line 67, "Sill2" should be --$SiH_2$--;

Column 14:
Line 38, "clue" should be --due--;
Line 47, "niicrocrystalline" should be --microcrystalline--;
Line 48, "inicrocrystalline" should be --microcrystalline--;

Column 15:
Line 22, "fonning" should be --forming--;

Column 16:
Line 25, "race" should be --rate--.

Signed and Sealed this

Eighteenth Day of November, 2008

JON W. DUDAS
*Director of the United States Patent and Trademark Office*